United States Patent

Preisler et al.

[11] Patent Number: 5,945,384
[45] Date of Patent: Aug. 31, 1999

[54] PROCESS FOR PRODUCING TUBULAR MOLDINGS FROM HIGH-TEMPERATURE SUPERCONDUCTING MATERIAL

[75] Inventors: Eberhard Preisler, Erftstadt-Liblar; Joachim Bock, Erftstadt, both of Germany

[73] Assignee: Hoechst Aktiengesellschaft, Germany

[21] Appl. No.: 08/671,825

[22] Filed: Jun. 25, 1996

Related U.S. Application Data

[63] Continuation of application No. 08/291,080, Aug. 17, 1994, abandoned, which is a continuation of application No. 08/054,007, Apr. 26, 1993, abandoned.

[30] Foreign Application Priority Data

May 9, 1992 [DE] Germany .............................. 42 15 289

[51] Int. Cl.$^6$ .................................................. H01L 39/00
[52] U.S. Cl. ..................... 505/450; 264/104; 264/235; 264/310; 264/311
[58] Field of Search .................... 264/104, 235, 264/310, 311; 505/450

[56] References Cited

U.S. PATENT DOCUMENTS 5,253,697 10/1993 Lajoye et al. .............................. 164/97
5,262,366 11/1993 Yamakawa et al. ...................... 501/95

FOREIGN PATENT DOCUMENTS 4013368 12/1991 Germany .
4019368 12/1991 Germany .

*Primary Examiner*—Christopher A. Fiorilla
*Attorney, Agent, or Firm*—Connolly & Hutz

[57] ABSTRACT

In order to produce tubular moldings of high-temperature superconducting material based on oxides of bismuth, calcium, strontium, copper and optionally lead, a homogeneous melt of the oxide mixture in a predefined stoichiometry having temperatures from 900 to 1300° C. is made to flow into a casting zone. The casting zone, as a function of its internal diameter, rotates at from 200 to 1500 rpm about its axis which is inclined by at least 15° with respect to the horizontal. The solidified molding is taken from the casting zone and annealed for from 4 to 150 hours at from 700 to 900° C. in an oxygen-containing atmosphere.

4 Claims, 3 Drawing Sheets

1

PROCESS FOR PRODUCING TUBULAR MOLDINGS FROM HIGH-TEMPERATURE SUPERCONDUCTING MATERIAL

CROSS-REFERENCE TO RELATED APPLICATION

This application is a continuation of application Ser. No. 08/291,080, filed Aug. 17, 1994, now abandoned, which is in turn a continuation of Ser. No. 08/054,007, filed Apr. 26, 1993, now abandoned.

The present invention relates to a process for producing tubular moldings from high-temperature superconducting material based on oxides of bismuth, calcium, strontium, copper and optionally lead, in which a homogeneous melt of the oxide mixture is prepared in a predefined stoichiometry, and in which the melt having temperatures from 900 to 1300° C. is made to flow into a casting zone which, as a function of its internal diameter, rotates at from 200 to 1500 rpm about its axis, and in which the solidified molding is taken from the casting zone, and in which the molding is annealed for from 4 to 150 hours at from 700 to 900° C. in an oxygen-containing atmosphere.

German Offenlegungsschrift 40 19 368 discloses a process for producing tubular parts of high-temperature superconducting material based on the oxides of bismuth, calcium, strontium and copper, in which a homogeneous melt of the oxide mixture having temperatures from 900 to 1100° C. is made to flow into a casting zone rotating about its horizontal axis and is allowed to solidify there. The solidified molding taken from the casting zone is subsequently annealed at temperatures from 700 to 900° C. for from 4 to 150 hours in an oxygen-containing atmosphere.

If low-temperature superconducting systems, especially coils which have to be operated at 4 K with liquid-helium cooling, are fed with electrical current via copper conductors, then, on the one hand, heat is transferred via the temperature gradient between 300 K and 4 K and, on the other hand, Joule heat is transferred via the electrical resistance of the copper into the liquid helium stock, as a result of which unwanted evaporation of helium takes place.

Now if the electric current, instead of through a copper conductor, is fed in through a ceramic high-temperature superconductor, the heat inflow to the liquid helium stock is reduced considerably; this is due, firstly, to the lower heat conductivity of the high-temperature superconductor compared to the efficiently heat-conductive copper and, secondly, to Joule heat no longer being produced, since in the temperature range below the transition temperature of the high-temperature superconductor current is carried without resistance.

Because of the magnetic field in the conductor generated by its own current, the so-called magnetic self-field effect, it is better to use tubular rather than rod-shaped leads, since, owing to the distribution of the current-carrying cross section over a larger area, the magnetic self-field and therefore also the adverse effect on the current-carrying capacity of the conductor becomes smaller.

The amount of heat fed to the liquid helium stock is determined by the cross section of the lead of high-temperature superconducting material. In this context account must be taken of the fact that carrying a particular current through a high-temperature superconductor requires a certain minimum cross section. The high-temperature superconducting material obtained from the melt of the oxides of bismuth, calcium, strontium, copper and optionally lead in this context has the advantage that its current-carrying capacity at 4 K is approximately 50 to 100 times greater than at 77 K, i.e. that the material cross section at the lower temperature in the helium-cooling range is hugely oversized. It would therefore be advantageous to design the leads feed by means of the high-temperature superconductor in such a way that the current-carrying cross section of the "cold" end (4 K) would only be from 10 to 20% of the cross section at the "warm" end (77 K).

It is therefore an object of the present invention to provide a process for producing such tubular parts from high-temperature superconducting material based on oxides of bismuth, calcium, strontium, copper and optionally lead, whose cross sections at their two ends differ considerably from each other. This is achieved according to the invention by making a homogeneous melt of the oxide mixture having temperatures from 900 to 1300° C. flow into a casting zone which, as a function of its internal diameter, rotates at from 200 to 1500 rpm about its axis, the axis being inclined by at least 15° with respect to the horizontal, and then annealing the solidified molding taken from the casting zone at temperatures of from 700 to 900° C. in an oxygen-containing atmosphere.

The process according to the invention may further be optionally developed in that a) the axis is inclined by up to 90° with respect to the horizontal;

b) the axis is inclined by from 20 to 60° with respect to the horizontal;

c) the casting zone is a permanent mold having a cylindrical interior;

d) the casting zone is a permanent mold having a cone-shaped interior;

e) larger inclinations of the rotating permanent mold with respect to the horizontal are associated with larger numbers of its revolution and vice versa.

The accompanying drawing shows a centrifugal casting apparatus and further shows tubular moldings, obtained by the process according to the invention, in diagrammatic form and in section. In the figures.

Figure 1:
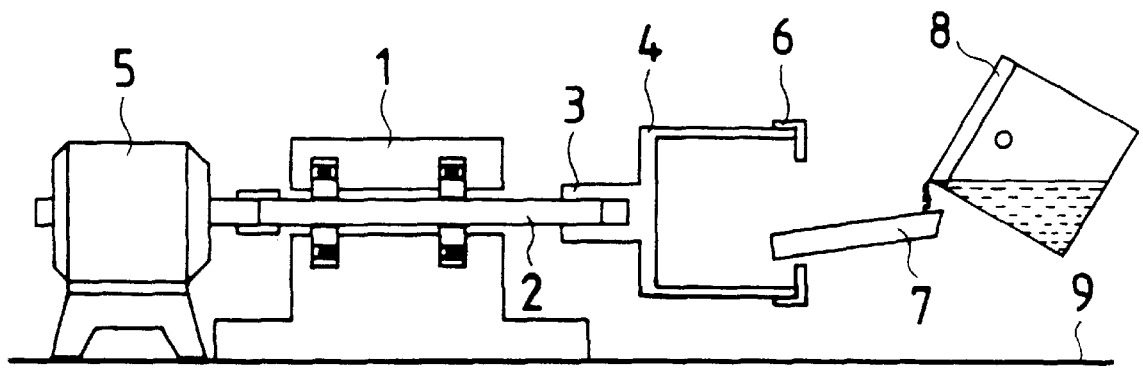
FIG. 1 shows a centrifugal casting apparatus with a horizontally arranged rotating shaft onto which the permanent mold has been pushed.

According to. FIG. 1, fixed to a tiltably arranged baseplate 9 are a journal bearing 1 and a variable-speed electric motor 5. Pushed onto one end of a shaft 2 positioned in the journal bearing 1 is the extension 3 of a permanent mold 4, while the other end of the shaft 2 is linked non-positively to the electric motor 5. Pushed onto the open end of the permanent mold 4 is an end ring 6. Projecting into the open end of the permanent mold 4 there is a pouring spout 7, which can be charged with melt from a crucible 8.

Figure 2:
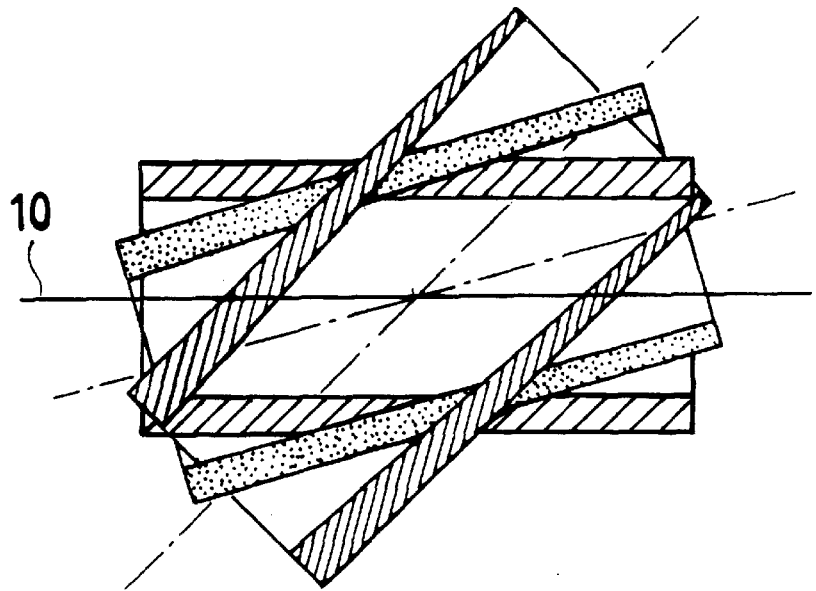
FIG. 2 shows moldings obtained in a cylindrical permanent mold.

FIG. 2 illustrates moldings which have been obtained at various angles of tilt with respect to the horizontal 10.

Figure 3:
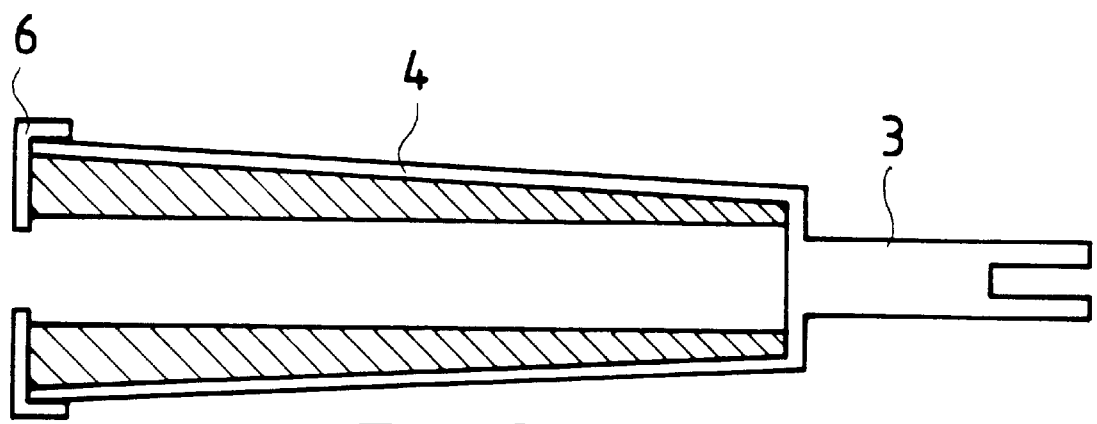
FIG. 3 shows a horizontally arranged cone-shaped permanent mold with molding.

FIG. 3 shows a cone-shaped permanent mold 4 with extension 3, onto which an end ring 6 has been pushed.

Figure 4:
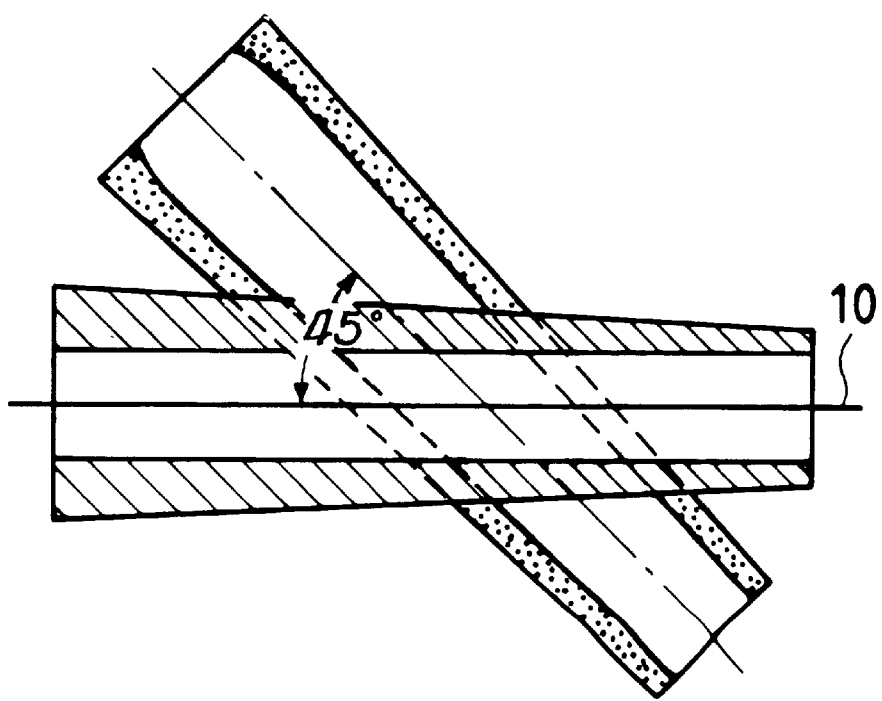
FIG. 4 shows moldings obtained in a cone-shaped permanent mold.

FIG. 4 illustrates two moldings which have been obtained in a permanent mold according to FIG. 3, one of these moldings having been obtained when the permanent mold was arranged in the horizontal 10, and the other when the permanent mold was tilted by 45°.

Figure 5:
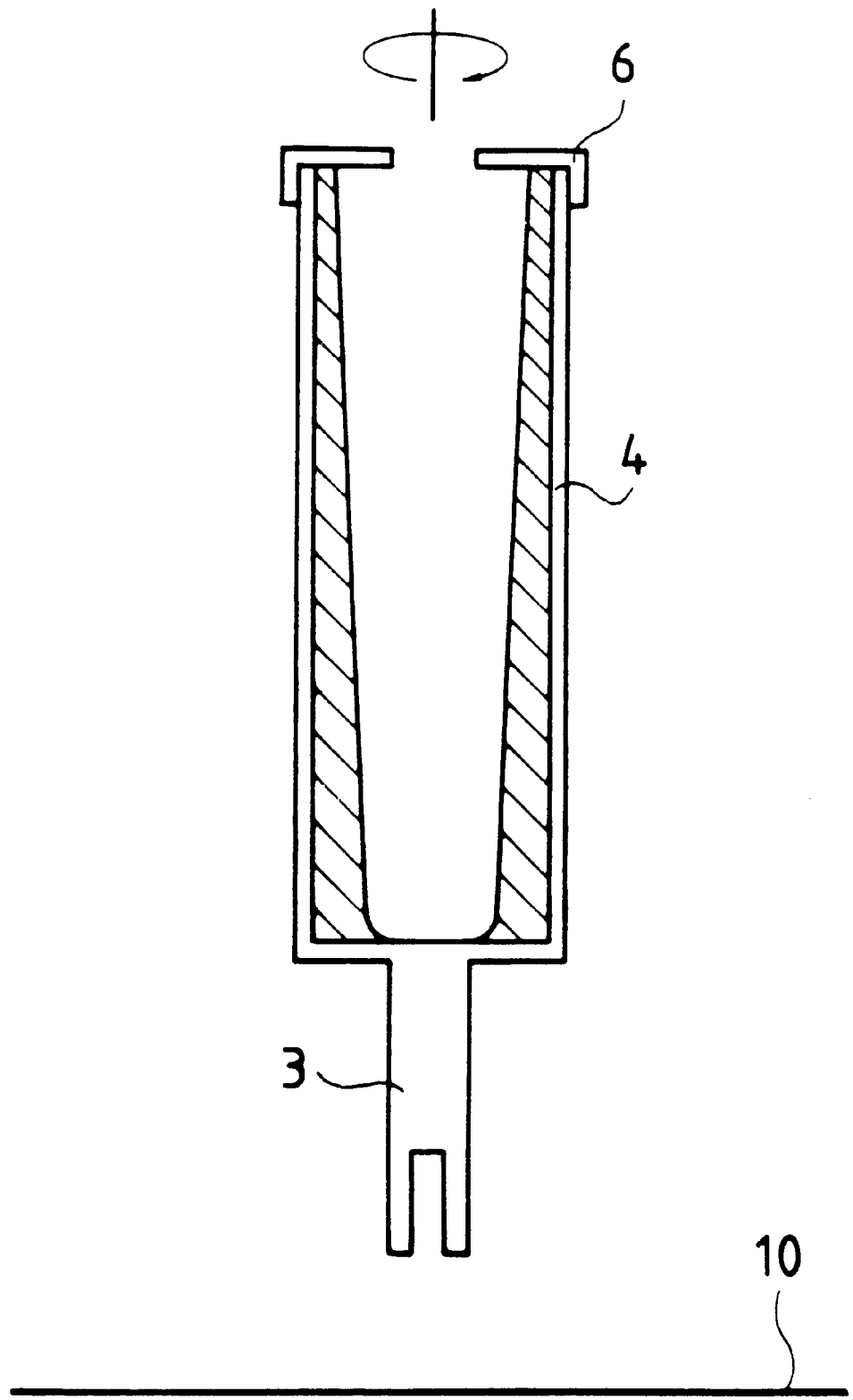
FIG. 5 shows a vertically arranged cylindrical permanent mold with molding.

FIG. 5 shows a cylindrical permanent mold 4, which has an extension 3 and whose shaft during casting rotates perpendicularly to the horizontal 10, an end ring 6 having been pushed onto the open side of the permanent mold 4.

In the process according to the invention, if the rotational axis of the permanent mold is lifted by a certain angle from the horizontal, then, in addition to centrifugal acceleration resulting from the rotation of the permanent mold, gravity comes into effect which, depending on the inclination of the axis, makes the still liquid melt flow into the lower-positioned region of the permanent mold. By varying the amount of melt, the rotational speed of the permanent mold and its angle with respect to the horizontal it is possible to cast tubes whose cross section at their upper and lower ends differ by a factor of from 3 to 4. (cf. FIG. 2).

The process according to the invention makes it possible to achieve even greater differences in the cross section between the upper and lower end of the moldings by using a frustoconical permanent mold 4 (cf. FIG. 3). The cross section reduction then depends on the geometry of the permanent mold and the degree to which it is filled.

While the use of a conical permanent mold in a horizontal arrangement according to the prior art results in the wall thickness decreasing towards the "slimmer" end, it is possible, according to the invention, to achieve an almost uniform thickness of the cone wall by inclining the axis of the conical permanent mold with respect to the horizontal, because in this case the melt is drawn downwards by gravity, while the centrifugal acceleration pushes the melt towards the open end along the shell surface (cf. FIG. 4).

In the process according to the invention, to each inclination of the axis of the rotating casting zone a particular number of revolutions of the casting zone per unit time should be assigned, which depends on further parameters (length, shape and free cross section of the casting zone, viscosity of the melt etc.), which results in approximate balance of the opposite forces acting on the melt introduced into the casting zone (centrifugal acceleration, attraction of the earth).

In the process of the invention angles of inclination between 15 and 18° when using a cylindrical permanent mold result in moldings which are shaped cylindrically on the outside and are shaped conically on the inside; if the angle of inclination is 90° with respect to the horizontal, the resulting molding is shaped parabolically on the inside (cf. FIG. 5).

In the following examples, a high-temperature superconductor of the composition $Bi_2Sr_2CaCu_2O_{8+x}$ (with x=0 to 0.3) was prepared. If the composition is changed appropriately or if the pretreatment and secondary treatment parameters are adapted, it is however also possible to prepare other fusible high-temperature superconductors based on bismuth in a similar manner.

EXAMPLE 1 (according to the prior art)

400 g of a mixture of the oxides of bismuth, strontium, calcium and copper in a molar ratio of the metals of 2:2:1:2 were melted in a crucible of sintered corundum at 1050° C. A cylindrical permanent mold 4 (internal diameter: 47 mm, length: 100 mm) had been pushed onto the shaft 2, which was non-positively linked to the electric motor 5, and was provided with an end ring 6 (cf. FIG. 1), the shaft of the permanent mold 4 running horizontally (angle of pitch: 0°). As the permanent mold 4 rotated at 750 rpm, the melt was poured from the crucible 8 via the pouring spout 7 into the permanent mold 4. After the melt had solidified, the cylindrical molding was taken from the permanent mold and annealed for 100 hours at 840° C. The cross-sectional areas of the superconducting molding were approximately equal at its two ends (cf. FIG. 2 and Table 1).

EXAMPLE 2 (according to the invention)

Example 1 was repeated, with the modification that, on the one hand, the shaft of the permanent mold was tilted with respect to the horizontal (angles of pitch: 20°, 45° and 90°) and that, on the other hand, higher rotational speeds of the permanent mold were used.

The cross-sectional areas of the superconducting moldings were different from one another at their two ends (cf. FIG. 2 and Table 1).

EXAMPLE 3 (according to the invention)

The Examples 1 and 2 were repeated, with the modification that a cylindrical permanent mold having an internal diameter of 35 mm was used and that rotational speeds from 1000 to 1400 rpm were used for the permanent mold.

The dimensions of the superconducting moldings are given in Table 2.

EXAMPLE 4 (according to the invention)

Similar to Example 1, a conical permanent mold 4, one end of which had an internal diameter of 45 mm and the other end of which had an internal diameter of 25 mm, with a length of 150 mm, was pushed onto the shaft 2 which was non-positively linked to the electric motor 5.

The varying sample weights of the oxide mixture, the various rotational speeds for the conical permanent mold and the different angles of pitch of the shaft thereof can be seen in Table 3.

TABLE 1

Cylindrical hollow bodies having an external diameter of 47 mm

| Example | 1 | 2a | 2b | 2c | 2d |
|---|---|---|---|---|---|
| Rotational speed (rpm) | 750 | 750 | 750 | 850 | 1050 |
| Angle of pitch [degrees] | 0 | 20 | 45 | 45 | 90 |
| Db [mm] | 5.84 | 7.02 | 7.67 | 9.18 | 10.60 |
| Dt [mm] | 5.60 | 5.34 | 3.40 | 3.78 | 6.03 |
| Fb [cm$^2$] | 8.10 | 9.48 | 10.20 | 11.77 | 13.12 |
| Ft [cm$^2$] | 7.81 | 7.49 | 4.98 | 5.49 | 6.03 |
| Ft/Fb | 0.96 | 0.79 | 0.49 | 0.47 | 0.46 |
| Weight [g] | 400 | 443 | 360 | 437 | 421 |

Legend:
Db = wall thickness bottom
Dt = wall thickness top
Fb = end face bottom
Ft = end face top

TABLE 2

Cylindrical hollow bodies having an external diameter of 35 mm

| Example | 3a | 3b | 3c | 3d | 3e |
|---|---|---|---|---|---|
| Rotational speed (rpm) | 1000 | 1350 | 1350 | 1100 | 1400 |
| Angle of pitch [degrees] | 0 | 20 | 45 | 90 | 90 |
| Db [mm] | 4.01 | 5.49 | 6.70 | 8.80 | 7.31 |
| Dt [mm] | 3.98 | 2.68 | 2.20 | 2.60 | 2.41 |
| Fb [cm$^2$] | 3.90 | 5.42 | 5.96 | 7.24 | 6.36 |
| Ft [cm$^2$] | 3.86 | 2.68 | 2.27 | 2.65 | 2.41 |
| Ft/Fb | 0.99 | 0.49 | 0.38 | 0.37 | 0.38 |
| Length [mm] | 200 | 200 | 170 | 137 | 139 |
| Weight [g] | * | 443 | 385 | 371 | 335 |

Legend:
Db = wall thickness bottom
Dt = wall thickness top
Fb = end face bottom
Ft = end face top
* not determined

TABLE 3

Conical hollow bodies

| No. | Mass [g] | Rpm | Angle of pitch [degrees] | Diameter [mm] top internal | top external | bottom internal | bottom external | Length [mm] | eff. cross section [cm$^2$] Ft | Fb | Ft/Fb |
|---|---|---|---|---|---|---|---|---|---|---|---|
| 1 | 422 | 1100 | 0 | 26.4 | 29.4 | 26.7 | 45.9 | 122* | 1.31 | 10.95 | 0.12 |
| 2 | 570 | 1100 | 0 | 21.7 | 25.8 | 21.5 | 45.6 | 149 | 1.53 | 12.70 | 0.12 |
| 3 | 570 | 1100 | 25 | 18.0 | 25.6 | 24.7 | 45.9 | 150 | 2.60 | 11.80 | 0.22 |
| 4 | 500 | 1100 | 45 | 18.3 | 25.7 | 32.0 | 46.0 | 149 | 2.56 | 8.68 | 0.30 |
| 5 | 500 | 800 | 30 | 15.2 | 25.8 | 31.1 | 45.9 | 144 | 3.41 | 8.95 | 0.38 |
| 6 | 300 | 800 | 30 | 25.0 | 29.3 | 33.6 | 45.9 | 120* | 1.83 | 7.68 | 0.23 |

Legend:
Fb = end face bottom
Ft = end face top
*moldings shortened by approximately 30 mm at their slimmer end In Table 3, entry No. 3, the exterior diameter of the conical hollow body at the top or small end of the mold is 25.6 mm, and the adjacent interior diameter of the small end of the mold is also 25.6 mm. Additionally, the external diameter of the conical hollow body at the bottom or large end of the mold is 45.9 mm, and the adjacent interior diameter of the large end of the mold is also 45.9 mm. The radial difference from the small end of the mold (r=12.8 mm) to the large end of the mold (R=22.8 mm) is 10 mm over a mold length of 150 mm. Similar calculations may be made for the other entry Nos. of Table 3. Accordingly, the proportional radial difference from the small end of the mold to the large end of the mold per mold length is at least 10:150. Table 3, entry No. 5 has a wall thickness at the top or small end of the conical hollow body of 5.3 mm. This is computed by determining the difference between the internal and external diameters at the top end of the hollow body and dividing by 2 (25.8–15.2/2) which reveals a thickness of 5.3 mm. Similarly, the thickness of the conical body at the bottom or large end thereof is the difference between the external and internal diameters divided by 2 (45.9–31.1/2) or 7.4 mm. Hence, the ratio of the thickness of the tubular molding at the bottom end face relative to the end of the thickness at the top end face is 14 (7.4/5.3) Similar ratios for entry Nos. 3, 4 and 6 are 2.79, 1.89 and 2.86, respectively.

We claim:

1. A process for producing a tubular molding from high-temperature superconducting material based on an oxide of bismuth, calcium, strontium, copper and optionally lead comprising the steps of providing a casting mold having a conically shaped interior with a proportional radial difference from a small end of the mold to a large end per mold length of at least 10:150, and an axis of rotation inclined by at least 20° with respect to the horizontal, preparing a homogeneous melt of a mixture of these oxides, flowing the melt at temperatures from 900 to 1300° C. into the casting mold, rotating the casting mold at least 800 rpm about its axis of rotation to produce a tubular molding having an annular cross-sectional area at a top end face at the small end of the mold which is significantly different in magnitude from an annular cross-sectional area at a bottom end face at the large end of the mold and wherein the ratio of the annular cross-sectional area at the top end face to the annular cross-sectional area at the bottom end face is 0.38 or less, and wherein the ratio of the thickness of the tubular molding at the bottom end face relative to the thickness at the top end face is at least 1.4, removing the tubular molding from the casting mold, and annealing the tubular molding for 4 to 150 hours at from 700 to 900° C. in an oxygen-containing atmosphere.

2. A process for producing a tubular molding as in claim 1 wherein the axis of rotation of the casting mold is inclined 20 to 60° with respect to the horizontal.

3. A process for producing a tubular molding as in claim 1 wherein the casting molding has a cylindrical exterior.

4. A process for producing a tubular molding as in claim 1 wherein the axis of rotation of the casting mold is 90° with respect to the horizontal.

* * * * *